United States Patent [19]
Perkins

[11] Patent Number: 5,552,742
[45] Date of Patent: Sep. 3, 1996

[54] CIRCUIT FOR CONTROLLING CURRENT FLOW BETWEEN TWO NODES

[75] Inventor: Geoffrey W. Perkins, Chandler, Ariz.

[73] Assignee: Motorola, Inc., Schaumburg, Ill.

[21] Appl. No.: 387,690

[22] Filed: Feb. 13, 1995

[51] Int. Cl.⁶ ........................................ G06G 7/26
[52] U.S. Cl. .............................. 327/563; 330/252
[58] Field of Search ........................ 327/560, 561, 327/562, 563, 308, 532; 330/250, 252, 253, 288

[56] References Cited

U.S. PATENT DOCUMENTS

| | | | |
|---|---|---|---|
| 4,079,238 | 3/1978 | Campe et al. | 327/552 |
| 4,306,695 | 12/1981 | Campbell | 327/552 |
| 4,350,956 | 9/1982 | DuPuy | 327/561 |
| 5,266,852 | 11/1993 | Shigenari et al. | 330/252 |

*Primary Examiner*—Timothy P. Callahan
*Assistant Examiner*—Kenneth B. Wells
*Attorney, Agent, or Firm*—Robert D. Atkins

[57] ABSTRACT

A controllable resistance circuit (16, 20) changes effective resistance value in response to an external control signal. The control circuit uses a simple current steering mechanism (32, 34, 38, 40, 42, 44, 46, 48) through a fixed resistor (62) to allow uni-directional or bi-directional operation. When configured as a bi-directional device, both ends of the effective resistance circuit (18, 24) are high impedance and therefore float with respect to any power supply. The effective resistance can be set with the control voltage and adjusted with changing conditions.

20 Claims, 2 Drawing Sheets

5,552,742

1

CIRCUIT FOR CONTROLLING CURRENT FLOW BETWEEN TWO NODES

BACKGROUND OF THE INVENTION

The present invention relates in general to electronic circuits and, more particularly, to a circuit for controlling an effective resistance between two nodes.

Most if not all electronic circuits commonly use resistors to set the current flow between two nodes. Fixed resistors can easily be implanted into an integrated circuit, or otherwise placed in a discrete circuit, to set a particular resistance value. The current flow is determined by the well known Ohm's law where I=V/R.

Many applications such as filters require tuning or adjustments to achieve the intended circuit function. For example, the cut-off frequency of a low-pass filter is set by selecting particular values of resistors and capacitors. In the prior art, the resistor value is often set during calibration and test by a trimming operation where sections of the resistor are removed until the circuit operates as desired. However, once the resistor value is fixed, it becomes difficult to change. Any change in conditions such as temperature, moisture, and component drift can effect the circuit operation.

One potential solution is to use variable resistors that can be adjusted with changing conditions. Resistors need to be bi-directional in order to behave properly with AC signals. That is, the resistor must be able to float with high impedance at both ends. Transconductance amplifiers are generally uni-directional devices, i.e. floating at one end with the other end at a low impedance voltage source, and therefore not well suited for bi-directional operation. The prior art has shown that it is possible to achieve bi-directional operation with certain configurations of transconductance amplifiers. For example, a three-amplifier arrangement that provides bi-directional variable resistance is shown in a book entitled *Introduction to the Design of Transconductor Capacitor Filters* by Jaime E. Kardontchik, Kluwer Academic Publishers, page 27. However, the three-amplifier arrangement serves as only a single variable resistor. In applications that require several variable resistors, such an approach is impractical as it becomes difficult to control all three amplifiers simultaneously and the complex circuit consumes an excessive amount of physical space.

Hence, a need exists for a simple, controllable resistance circuit that can operate either uni-directional or bi-directional.

DETAILED DESCRIPTION OF THE PREFERRED EMBODIMENT

Figure 1:
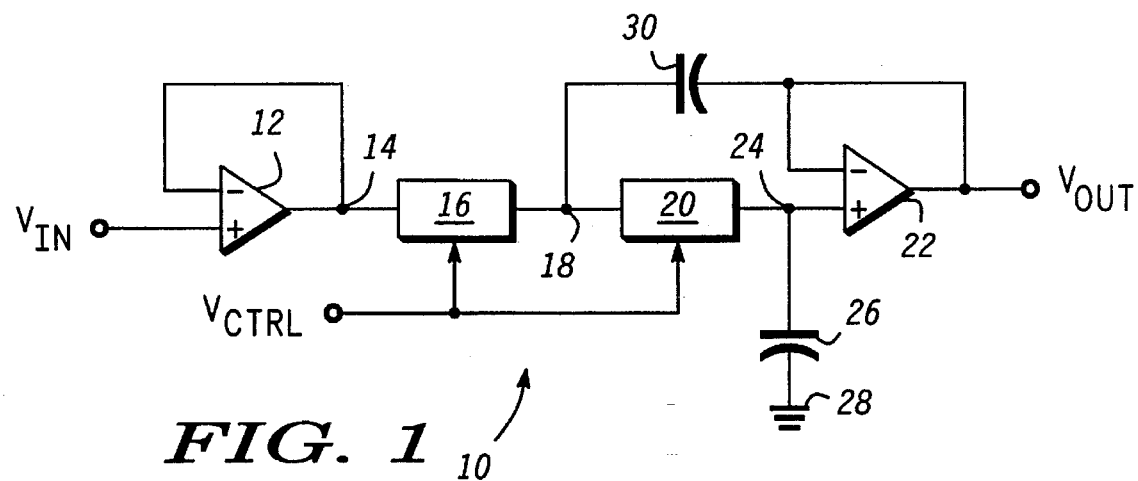
FIG. 1 is a block diagram illustrating a low-pass filter with controllable resistance circuits.

Referring to FIG. 1, a low-pass filter circuit 10 is shown suitable for manufacturing as an integrated circuit using conventional integrated circuit processes. An analog input signal $V_{IN}$ is applied to the non-inverting input of amplifier 12. The output of amplifier 12 is coupled to its inverting input at node 14 in a voltage follower buffer configuration. A controllable resistance circuit 16 is coupled between node

2

14 and node 18. Another controllable resistance circuit 20 is coupled between node 18 and the non-inverting input of amplifier 22 at node 24. Capacitor 26 is coupled between node 24 and power supply conductor 28 operating at ground potential. The output of amplifier 22 is coupled to its inverting input and provides the filtered output signal $V_{OUT}$. Capacitor 30 is coupled between the inverting input of amplifier 22 and node 18.

The circuit arrangement in FIG. 1 operates as a low-pass Sallen-Key filter because of placement of controllable resistance circuits 16 and 20 and capacitors 26 and 30. One feature of the present invention is that resistance circuits 16 and 20 have variable effective resistance in response to control signal $V_{CTRL}$. Controllable resistance circuit 16 is uni-directional in that node 14 is a low impedance point, while node 18 is a high impedance point allowing current to flow from node 14 to node 18. That is, node 14 is fixed by the output of amplifier 12, while node 18 floats with respect to any supply voltage. Controllable resistance circuit 20 is bi-directional in that nodes 18 and 24 are both high impedance points allowing both ends of resistance circuit 20 to float.

Figure 2:
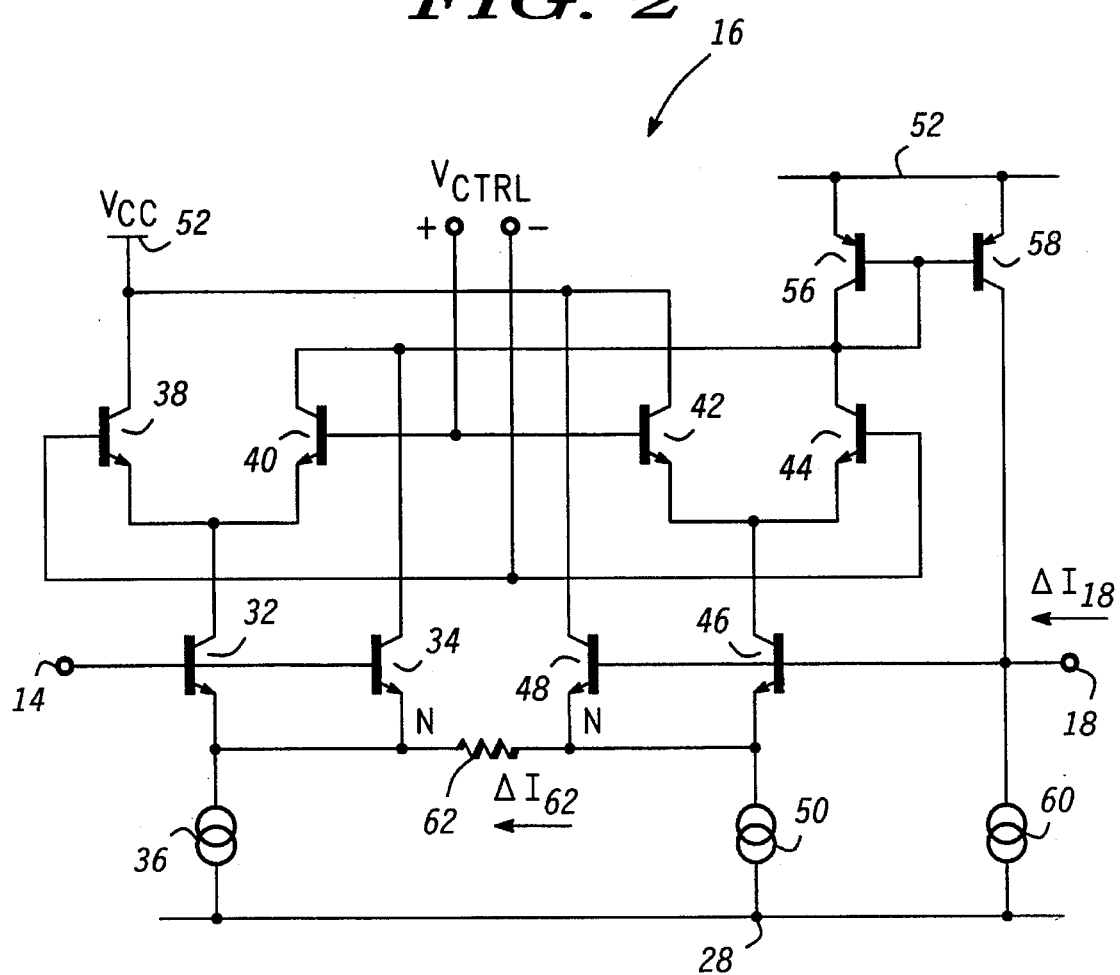
FIG. 2 is a schematic diagram illustrating the uni-directional controllable resistance circuit of FIG. 1.

Turning to FIG. 2, further detail of controllable resistance circuit 16 is shown including transistors 32 and 34 both having a base coupled to node 14. The emitters of transistors 32 and 34 are coupled to current source 36. The collector of transistor 32 is coupled to the emitters of transistors 38 and 40. Control signal $V_{CTRL}$ is a differential signal with the positive component applied to the bases of transistors 40 and 42 and the negative component applied to the bases of transistors 38 and 44. The emitters of transistors 42 and 44 are coupled together to the collector of transistor 46. The bases of transistors 46 and 48 are coupled to node 18, and the emitters of transistors 46 and 48 are coupled to current source 50. The collectors of transistors 38, 42, and 48 are coupled to power supply conductor 52 operating at a positive potential $V_{cc}$ such as 3.0 volts. The collectors of transistors 34, 40, and 44 are coupled to the base and collector of transistor 56. The base of transistor 58 is coupled to the base and collector of transistor 56, while the emitters of transistors 56 and 58 are coupled to power supply conductor 52. Thus, transistors 56 and 58 operate as a current mirror. The collector of transistor 58 is coupled to current source 60 at node 18. Current sources 36, 50, and 60 are each selected at 20.0 microamps.

The emitter area of transistor 34 is made "N" times the emitter area of transistor 32 and conducts "N" times the current given the same base drive. Likewise, the emitter area of transistor 48 is made "N" times the emitter area of transistor 46 arid conducts "N" times the current given the same base drive. The value "N" may be selected as three, but should be larger than two to avoid latching. A fixed valued resistor 62 is coupled between the emitters of transistors 32 and 34 and the emitters of transistors 46 and 48. Resistor 62 is selected at $R_{62}$=20.0 Kohms.

The operation of controllable resistance circuit 16 proceeds as follows. Assume a delta current $\Delta I_{18}$ flows into node 18 given its floating property. The $\Delta I_{18}$ current flows through transistors 58 and 56 by nature of the current mirror arrangement where it is split between transistors 34, 40, and 44 depending on the magnitude and polarity of $V_{CTRL}$. If $V_{CTRL}$ is maximum negative, say −100 millivolts differential, then transistors 38 and 44 are substantially full on and transistors 40 and 42 are substantially full off. The delta current $\Delta I_{18}$ flows through transistors 44 and 46 into one end of resistor 62 and through transistor 34 into the other end of resistor 62, resulting in a delta current $\Delta I_{62}$ in resistor 62 attributable to delta current $\Delta I_{18}$.

The delta current $\Delta I_{40}$ in transistor 40 is equal to zero because it is non-conductive. The delta current $\Delta I_{44}$ in transistor 44 is equal to $\Delta I_{62}/(N+1)$. Likewise, the delta current $\Delta I_{46}$ in transistor 46 is equal to $\Delta I_{62}/(N+1)$ and the delta current $\Delta I_{48}$ in transistor 48 is equal to $\Delta I_{62}*N/(N+1)$ because of the ratio of emitter areas in transistors 46 and 48. The delta current $\Delta I_{34}$ in transistor 34 is equal to $-\Delta I_{62}*N/(N+1)$ and the delta current $\Delta I_{32}$ in transistor 32 is equal to $-\Delta I_{62}/(N+1)$ because of the ratio of emitter areas in transistors 32 and 34. The delta current $\Delta I_{56}$ in transistor 56 is equal to $\Delta I_{18} = \Delta I_{56} = \Delta I_{40} + \Delta I_{44} + \Delta I_{34}$. The above equation reduces to $\Delta I_{18} = \Delta I_{62}(N-1)/(N+1)$. Since resistance is inversely proportional to current, the effective resistance of resistor 62 is $R_{62}(N+1)/(N-1)$ at the maximum negative control signal $V_{CTRL}$.

Next, consider the control voltage $V_{CTRL}$ at a midpoint where transistors 38–44 are conducting substantially equally. Transistors 38, and 40 operate to steer current into transistor 32 in response to $V_{CTRL}$, while transistors 42 and 44 operate to steer current into transistor 46 in response to $V_{CTRL}$. The delta current $\Delta I_{40}$ is equal to $-0.5*\Delta I_{62}/(N+1)$. The delta current $\Delta I_{44}$ is equal to $0.5*\Delta I_{62}/(N+1)$. The delta current $\Delta I_{34}$ remains equal to $-\Delta I_{62}*N/(N+1)$. The delta current $\Delta I_{56}$ is equal to $\Delta I_{18} = \Delta I_{56} = \Delta I_{40} + \Delta I_{44} + \Delta I_{34}$. The above equation reduces to $\Delta I_{18} = \Delta I_{62}*N/(N+1)$. Therefore, the effective resistance of resistor 62 is $R_{62}(N+1)/N$ at the mid-range control signal $V_{CTRL}$.

Finally, consider the control voltage $V_{CTRL}$ at a maximum positive value such as +100 millivolts differential where transistors 40 and 42 are substantially full on and transistors 38 and 44 are substantially full off. The delta current $\Delta I_{40}$ is equal to $-\Delta I_{62}/(N+1)$. The delta current $\Delta I_{44}$ is equal to zero because it is non-conductive. The delta current $\Delta I_{34}$ is equal to $-I_{62}*N/(N+1)$. The delta current $\Delta I_{56}$ is equal to $\Delta I_{18} = \Delta I_{56} = \Delta I_{40} + \Delta I_{44} + \Delta I_{34}$. The above equation reduces to $\Delta I_{18} = -\Delta I_{62}(N+1)/(N+1)$. Therefore, the effective resistance of resistor 62 is $R_{62}(N+1)/(N+1) = R_{62}$ at the maximum positive control signal $V_{CTRL}$. The overall effective range of resistance circuit 16 given N=3 is thus from $R_{62}$ to $2R_{62}$ in response to control voltage $V_{CTRL}$.

Figure 3:
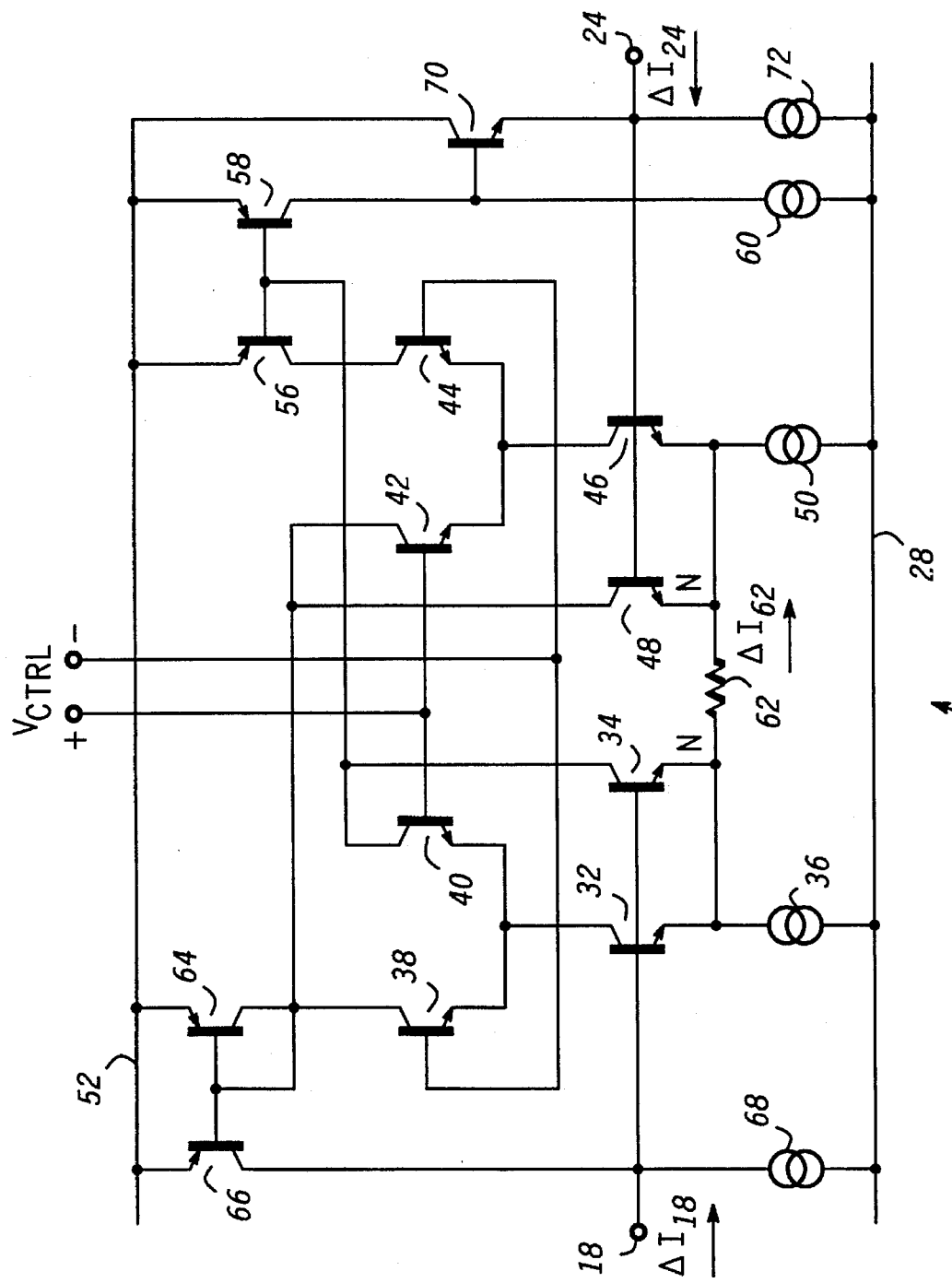
FIG. 3 is a schematic diagram illustrating the bi-directional controllable resistance circuit of FIG. 1.

Controllable resistance circuit 20 is shown in FIG. 3 having a similar construction and operation as resistance circuit 16 in FIG. 2. Components having a similar function are assigned the same reference number used in FIG. 2. Controllable resistance circuit 20 further includes a current mirror arrangement with transistors 64 and 66 that allows node 18 to float. The base and collector of transistor 64 are coupled to the collector of transistor 38 and to the base of transistor 66. The emitters of transistors 64 and 66 are coupled to power supply conductor 52. The collector of transistor 66 is coupled to current source 68 at node 18.

In addition, a buffer transistor 70 is provided in an emitter-follower configuration at the collector of transistor 58. The emitter of transistor 70 is coupled to the bases of transistors 46 and 48 at node 24. Current source 72 is coupled to the emitter of transistor 72. Current sources 68 and 72 are each selected at 20.0 microamps.

The effective resistance values of resistance circuit 20 for a delta current $\Delta I_{24}$ from node 24 is the same as calculated above in FIG. 2. The effective resistance values of resistance circuit 20 for a delta current $\Delta I_{18}$ from node 18 is determined as follows.

Assume a current $\Delta I_{18}$ flows into node 18 given its floating property. The $\Delta I_{18}$ current flows through transistors 66 and 64 by nature of the current mirror arrangement where it is split between transistors 38, 42, and 48 depending on the magnitude and polarity of $V_{CTRL}$. If $V_{CTRL}$ is maximum negative, then transistors 38 and 44 are substantially full on and transistors 40 and 42 are substantially full off. The delta current $\Delta I_{18}$ flows through transistors 38 and 32 into one end of resistor 62 and through transistor 48 into the other end of resistor 62, resulting in a delta current $\Delta I_{62}$ in resistor 62 attributable to delta current $\Delta I_{18}$.

The delta current $\Delta I_{42}$ is equal to zero because it is non-conductive. The delta current $\Delta I_{38}$ in transistor 38 is equal to $\Delta I_{62}/(N+1)$. Likewise, the delta current $\Delta I_{32}$ is equal to $\Delta I_{62}/(N+1)$ and the delta current $\Delta I_{34}$ is equal to $\Delta I_{62}*N/(N+1)$ because of the ratio of emitter areas in transistors 32 and 34. The delta current $\Delta I_{48}$ is equal to $-\Delta I_{62}*N/(N+1)$ and the delta current $\Delta I_{46}$ is equal to $-\Delta I_{62}/(N+1)$ because of the ratio of emitter areas in transistors 46 and 48. The delta current $\Delta I_{64}$ is equal to $\Delta I_{18} = \Delta I_{64} = \Delta I_{42} + \Delta I_{38} + \Delta I_{48}$. The above equation reduces to $\Delta I_{18} = \Delta I_{62}(N-1)/(N+1)$. Since resistance is inversely proportional to current, the effective resistance of resistor 62 is $R_{62}(N+1)/(N-1)$ at the maximum negative control signal $V_{CTRL}$.

Next, consider $V_{CTRL}$ at a mid-point where transistors 38–44 are conducting substantially equally. Transistors 38 and 40 operate to steer current into transistor 32 in response to $V_{CTRL}$, while transistors 42 and 44 operate to steer current into transistor 46 in response to $V_{CTRL}$. The delta current $\Delta I_{42}$ is equal to $-0.5*\Delta I_{62}/(N+1)$. The delta current $\Delta I_{38}$ is equal to $0.5*\Delta I_{62}/(N+1)$. The delta current $\Delta I_{48}$ is equal to $-\Delta I_{62}*N/(N+1)$. The delta current $\Delta I_{64}$ is equal to $\Delta I_{18} = \Delta I_{64} = \Delta I_{42} + \Delta I_{38} + \Delta I_{48}$. The above equation reduces to $\Delta I_{18} = \Delta I_{62}*N/(N+1)$. Therefore, the effective resistance of resistor 62 is $R_{62}(N+1)/N$ at the mid-range control signal $V_{CTRL}$.

Finally, consider the control voltage $V_{CTRL}$ at a maximum positive value where transistors 40 and 42 are substantially full on and transistors 38 and 44 are substantially full off. The delta current $\Delta I_{42}$ is equal to $-\Delta I_{62}/(N+1)$. The delta current $\Delta I_{38}$ is equal to zero because it is non-conductive. The delta current $\Delta I_{48}$ 34 is equal to $-I_{62}*N/(N+1)$. The delta current $\Delta I_{64}$ is equal to $\Delta I_{18} = \Delta I_{64} = \Delta I_{42} + \Delta I_{38} + \Delta I_{48}$. The above equation reduces to $\Delta I_{18} = -\Delta I_{62}(N+1)/(N+1)$. Therefore, the effective resistance off, resistor 62 is $R_{62}(N+1)/(N+1) = R_{62}$ at the maximum positive control signal $V_{CTRL}$. The overall effective range of resistance circuit 20 given N=3 is thus from $R_{62}$ to $2R_{62}$ in response to control voltage $V_{CTRL}$.

When resistor 16 and resistor 20 are placed in series as shown in FIG. 1, the current mirror transistors 56–58 can be merged with the current mirror transistors 64–66.

By now it should be appreciated that the present invention provides a resistance circuit that is controllable in response to an external control signal. The control circuit uses a simple current steering mechanism to allow uni-directional or bi-directional operation. When configured as a bi-directional device, both ends of the effective resistance circuit, i.e. nodes 18 and 24, are high impedance and therefore float with respect to any power supply. The effective resistance can be set with the control voltage and adjusted with changing conditions.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A controllable resistance circuit, comprising:

a first transistor having a base, an emitter and a collector, said base being coupled to a first node;

a second transistor having a base, an emitter and a collector, said base being coupled to said first node;

a first current source having an output coupled to said emitters of said first and second transistors;

a third transistor having a base, an emitter and a collector, said base being coupled to a second node, said collector being coupled to a power supply conductor;

a fourth transistor having a base, an emitter and a collector, said base being coupled to said second node;

a second current source having an output coupled to said emitters of said third and fourth transistors;

a resistor having a first end coupled to said emitters of said first and second transistors and having a second end coupled to said emitters of said third and fourth transistors;

a current mirror having an input and having an output coupled to said second node;

a first current steering circuit having a first input coupled to said input of said current mirror, a second input coupled to said power supply conductor, and an output coupled to said collector of said first transistor, said first current steering circuit being coupled for receiving a control signal at a control input for steering current between said first and second inputs of said first current steering circuit and said output of said first current steering circuit; and a second current circuit having a first input coupled to said input of said current mirror, a second input coupled to said power supply conductor, and an output coupled to said collector of said fourth transistor, said second current steering circuit being coupled for receiving said control signal at a control input for steering current between said first and second inputs of said second current steering circuit and said output of said second current steering circuit.

2. The controllable resistance circuit of claim 1 wherein said first current steering circuit includes a fifth transistor having a base, aniemitter and a collector, said base being coupled for receiving a first component of said control signal, said collector being coupled to said input of said current mirror, said emitter being coupled to said collector of said first transistor.

3. The controllable resistance circuit of claim 2 wherein said first current steering circuit further includes a sixth transistor having a base, an emitter and a collector, said base being coupled for receiving a second component of said control signal, said collector being coupled to said power supply conductor, said emitter being coupled to said collector of said first transistor.

4. The controllable resistance circuit of claim 1 wherein said second current steering circuit includes a fifth transistor having a base, an emitter and a collector, said base being coupled for receiving a first component of said control signal, said collector being coupled to said input of said current mirror, said emitter being coupled to said collector of said fourth transistor.

5. The controllable resistance circuit of claim 4 wherein said second current steering circuit further includes a sixth transistor having a base, an emitter and a collector, said base being coupled for receiving a second component of said control signal, said collector being coupled to said power supply conductor, said emitter being coupled to said collector of said fourth transistor.

6. The controllable resistance circuit of claim 1 wherein said emitter of said second transistor is sized to have an area "N" times that of said emitter of said first where "N" is a predetermined value that defines a ratio of emitter areas of said first and second transistors.

7. The controllable resistance circuit of claim 1 wherein said emitter of said third transistor is sized to have an area "N" times that of said emitter of said fourth transistor where "N" is a predetermined value that defines a ratio of emitter areas of said third and fourth transistors.

8. The controllable resistance circuit of claim 1 wherein said current mirror includes:

a fifth transistor having a base, an emitter and a collector, said collector being coupled to said second node, said emitter beings coupled to said power supply conductor; and a sixth transistor having a base, an emitter and a collector, said emitter being coupled to said power supply conductor, said base and collector being coupled to said base of said fifth transistor and to said first inputs of said first and second current steering circuits.

9. The controllable resistance circuit of claim 1 further including a third current source having an output coupled to said second node.

10. A controllable resistance circuit, comprising:

a first transistor having a base, an emitter and a collector, said base being coupled to a first node;

a second transistor having a base, an emitter and a collector, said base being coupled to said first node;

a first current source having an output coupled to said emitters of said first and second transistors;

a third transistor having a base, an emitter and a collector, said base being coupled to a second node, said collector being coupled to a power supply conductor;

a fourth transistor having a base, an emitter and a collector, said base being coupled to said second node;

a second current source having an output coupled to said emitters of said third and fourth transistors;

a resistor having a first end coupled to said emitters of said first and second transistors and having a second end coupled to said emitters of said third and fourth transistors;

a first current mirror having an input and having an output coupled to said first node;

a second current mirror having an input and having an output coupled to said second node;

a first current steering circuit having a first input coupled to said input of said first current mirror, a second input coupled to said input of said second current mirror, and an output coupled to said collector of said first transistor, said first current steering circuit being coupled for receiving a control signal at a control input for steering current between said first and second inputs of said first current steering circuit and said output of said first current steering circuit; and a second current steering circuit having a first input coupled to said input of said first current mirror, a second input coupled to said input of said second current mirror, and an output coupled to said collector of said fourth transistor, said second current steering circuit being coupled for receiving said control signal at a control input for steering current between said first and second inputs of said second current steering circuit and said output of said second current steering circuit.

11. The controllable resistance circuit of claim 10 wherein said first current steering circuit includes:

a fifth transistor having a base, an emitter and a collector, said base being coupled for receiving a first component of said control signal, said collector being coupled to said input of said first current mirror, said emitter being coupled to said collector of said first transistor; and a sixth transistor having a base, an emitter and a collector, said base being coupled for receiving a second component of said control signal, said collector being coupled to said input of said second current mirror, said emitter being coupled to said collector of said first transistor.

12. The controllable resistance circuit of claim 10 wherein said second current steering circuit includes:

a fifth transistor having a base, an emitter and a collector, said base being coupled for receiving a first component of said control signal, said collector being coupled to said input of said first current mirror, said emitter being coupled to said collector of said fourth transistor; and a sixth transistor having a base, an emitter and a collector, said base being coupled for receiving a second component of said control signal, said collector being coupled to said input of said second current mirror, said emitter being coupled to said collector of said fourth transistor.

13. The controllable resistance circuit of claim 10 wherein said emitter of said second transistor is sized to have an area "N" times that of said emitter of said first transistor where "N" is a predetermined value that defines a ratio of emitter areas of said first and second transistors.

14. The controllable resistance circuit of claim 10 wherein said emitter of said third transistor is sized to have an area "N" times that of said emitter of said fourth transistor where "N" is a predetermined value that defines a ratio of emitter areas of said third and fourth transistors.

15. The controllable resistance circuit of claim 10 wherein said first current mirror includes:

a fifth transistor having a base, an emitter and a collector, said collector being coupled to said first node, said emitter being coupled to said power supply conductor; and a sixth transistor having a base, an emitter and a collector, said emitter being coupled to said power supply conductor, said base and collector being coupled to said base of said fifth transistor and to said first inputs of said first and second current steering circuits.

16. The controllable resistance circuit of claim 10 wherein said second current mirror includes:

a fifth transistor having a base, an emitter and a collector, said collector being coupled to said second node, said emitter being coupled to said power supply conductor; and a sixth transistor having a base, an emitter and a collector, said emitter being coupled to said power supply conductor, said base and collector being coupled to said base of said fifth transistor and to said second inputs of said first and second current steering circuits.

17. The controllable resistance circuit of claim 10 further including:

a third current source having an output coupled to said first node;

a fourth current source having an output coupled to said output of said second current mirror;

a fifth transistor having a base, an emitter, and a collector, said collector being coupled to said power supply conductor, said base being coupled to said output of said second current mirror, said emitter being coupled to said second node; and a fifth current source having an output coupled to said emitter of said fifth transistor.

18. A filter circuit including:

a first amplifier having an input coupled for receiving an input signal;

a first controllable resistance circuit having a first end coupled to an output of said first amplifier at a first node and further having a control input coupled for receiving a control signal for controlling current flow between said first end and a second end of said first controllable resistance circuit;

a second controllable resistance circuit having a first end coupled to said second end of said first controllable resistance circuit at a second node and further having a control input coupled for receiving a control signal for controlling current flow between said first end and a second end of said second controllable resistance circuit;

a second amplifier having an input coupled to said second end of said second controllable resistance circuit at a third node and having an output for providing a filtered output signal; and a first capacitor coupled between said third node and a first power supply conductor.

19. The filter circuit of claim 18 wherein said first controllable resistance circuit includes:

a first transistor having a base, an emitter and a collector, said base being coupled to said first node;

a second transistor having a base, an emitter and a collector, said base being coupled to said first node;

a first current source having an output coupled to said emitters of said first and second transistors;

a third transistor having a base, an emitter and a collector, said base being coupled to said second node, said collector being coupled to a second power supply conductor;

a fourth transistor having a base, an emitter and a collector, said base being coupled to said second node;

a second current source having an output coupled to said emitters of said third and fourth transistors;

a resistor having a first end coupled to said emitters of said first and second transistors and having a second end coupled to said emitters of said third and fourth transistors;

a current mirror having an input and having an output coupled to said second node;

a fifth transistor having a base, an emitter and a collector, said base being coupled for receiving a first component of said control signal, said collector being coupled to said input of said current mirror, said emitter being coupled to said collector of said first transistor;

a sixth transistor having a base, an emitter and a collector, said base being coupled for receiving a second component of said control signal, said collector being coupled to said second power supply conductor, said emitter being coupled to said collector of said first transistor;

a seventh transistor having a base, an emitter and a collector, said base being coupled for receiving said first component of said control signal, said collector being coupled to said input of said current mirror, said emitter being coupled to said collector of said fourth transistor;

an eighth transistor having a base, an emitter and a collector, said base being coupled for receiving said second component of said control signal, said collector being coupled to said second power supply conductor, said emitter being coupled to said collector of said fourth transistor; and a third current source having an output coupled to said second node.

20. The filter circuit of claim 18 wherein said second controllable resistance circuit includes:

a first transistor having a base, an emitter and a collector, said base being coupled to said second node;

a second transistor having a base, an emitter and a collector, said base being coupled to said second node;

a first current source having an output coupled to said emitters of said first and second transistors;

a third transistor:having a base, an emitter and a collector, said base being coupled to said third node, said collector being coupled to a second power supply conductor;

a fourth transistor having a base, an emitter and a collector, said base being coupled to said third node;

a second current source having an output coupled to said emitters of said third and fourth transistors;

a resistor having a first end coupled to said emitters of said first and second transistors and having a second end coupled to said emitters of said third and fourth transistors;

a first current mirror having an input and having an output coupled to said second node;

a second current mirror having an input and having an output coupled to said third node;

a fifth transistor having a base, an emitter and a collector, said base being coupled for receiving a first component of said control signal, said collector being coupled to said input of said first current mirror, said emitter being coupled to said collector of said first transistor;

a sixth transistor having a base, an emitter and a collector, said base being coupled for receiving a second component of said control signal, said collector being coupled to said input of said second current mirror, said emitter being coupled to said collector of said first transistor;

a seventh transistor having a base, an emitter and a collector, said base being coupled for receiving said first component of said control signal, said collector being coupled to said input of said first current mirror, said emitter being coupled to said collector of said fourth transistor;

an eighth transistor having a base, an emitter and a collector, said base being coupled for receiving said second component of said control signal, said collector being coupled to said input of said second current mirror, said emitter being coupled to said collector of said fourth transistor;

a third current source having an output coupled to said first node;

a fourth current source having an output coupled to said output of said second current mirror;

a ninth transistor having a base, an emitter, and a collector, said collector being coupled to said second power supply conductor, said base being coupled to said output of said second current mirror, said emitter being coupled to said second node; and a fifth current source having an output coupled to said emitter of said fifth transistor.

* * * * *

UNITED STATES PATENT AND TRADEMARK OFFICE
CERTIFICATE OF CORRECTION

PATENT NO. : 5,552,742
DATED : September 3, 1996
INVENTOR(S) : Geoffrey W. Perkins It is certified that error appears in the above-indentified patent and that said Letters Patent is hereby corrected as shown below:

In claim 2, column 5, line 40, delete "aniemitter" and insert --an emitter--.

Signed and Sealed this

First Day of April, 1997

BRUCE LEHMAN

Attest:

Attesting Officer

Commissioner of Patents and Trademarks